United States Patent
Lee

(10) Patent No.: US 11,740,552 B2
(45) Date of Patent: Aug. 29, 2023

(54) PELLICLE STRUCTURE FOR EUV LITHOGRAPHY AND MANUFACTURING METHOD THEREFOR

(71) Applicant: ESOL Inc., Hwaseong-si (KR)

(72) Inventor: Dong Gun Lee, Hwaseong-si (KR)

(73) Assignee: ESOL Inc., Hwaseong-si (KR)

( * ) Notice: Subject to any disclaimer, the term of this patent is extended or adjusted under 35 U.S.C. 154(b) by 121 days.

(21) Appl. No.: 17/570,411

(22) Filed: Jan. 7, 2022

(65) Prior Publication Data

US 2023/0120353 A1 Apr. 20, 2023

(30) Foreign Application Priority Data

Oct. 15, 2021 (KR) .......................... 10-2021-0137580

(51) Int. Cl.
*G03F 1/62* (2012.01)
(52) U.S. Cl.
CPC ..................................... *G03F 1/62* (2013.01)

(58) Field of Classification Search
CPC ..................................... G03F 1/62; G03F 1/64
USPC ............................................................... 430/5
See application file for complete search history.

(56) References Cited

FOREIGN PATENT DOCUMENTS

KR 10-2013-0125295 A 11/2013

*Primary Examiner* — Christopher G Young
(74) *Attorney, Agent, or Firm* — Revolution IP, PLLC

(57) ABSTRACT

A manufacturing method includes the steps of: (a) preparing a lower layer member having a first base layer, a first protective thin film, and a first CNT thin film; (b) preparing a first upper layer member having a second base layer, a second protective thin film, and a second CNT thin film or a second upper layer member having a second base layer and a second protective thin film; (c) arranging the lower layer member above the first CNT thin film; (d) forming a group member by arranging the second CNT thin film of the first upper layer member or the second protective film of the second upper layer member to be stacked on the first CNT thin film; and € removing the second base layer from the group member.

7 Claims, 2 Drawing Sheets

PELLICLE STRUCTURE FOR EUV LITHOGRAPHY AND MANUFACTURING METHOD THEREFOR

BACKGROUND OF THE INVENTION

Field of the Invention

The present invention relates to a method of manufacturing a pellicle or a debris shield for EUV lithography, and more particularly, to a method for manufacturing a pellicle for EUV lithography which can minimize a damage of a carbon nano tube (CNT) thin film by arranging protective films on an upper layer and a lower layer of the carbon nano tube in order to prevent the CNT thin film from being damaged by a plasma when a pellicle is manufactured through the CNT thin film utilizing a carbon nano tube (CNT).

Background Art

As a circuit linewidth of a semiconductor device is miniaturized sharply, immersion ArF exposure equipment which uses a light source with a wavelength of 193 nm now in use has a limitation in forming a fine pattern. In order to form a fine pattern without improvement of the light source and the exposure equipment, dual or quadruple exposure technology is applied, but it causes various problems, such as increase in the number of processes, increase in process prices, and decrease in the number of processes per time, in manufacturing semiconductor devices that mass production is important.

In order to solve the above problems, next-generation exposure equipment to which extreme ultraviolet lithography technology which uses an extreme ultraviolet light source with wavelength of 13.5 nm is applied is being developed. Because light with wavelength of 13.5 nm used in the extreme ultraviolet lithography technology is absorbed in nearly all materials, a reflective reticle, such as a mirror, other than the existing transmissive reticle is used. The reflective reticle includes: a reflective multilayer film in which Mo/Si for reflecting extreme ultraviolet rays is deposited on a quartz blank mask, which is a low thermal expansion material (LTEM); a protective film for preventing damage to the reflective multilayer film; and a light absorption layer pattern for absorbing extreme ultraviolet rays to form a pattern.

A pellicle is used to protect the reflective reticle from contamination sources, such as organic matters, inorganic matters, particles, etc. which may degrade a manufacturing yield during an extreme ultraviolet lithography process.

Various studies for improving characteristics of the pellicle are being carried out. In detail, Korean Patent Publication No. 10-2013-0125295 (Applicant: SHIN-ETSU CHEMICAL CO., LTD) discloses a pellicle manufacturing method comprising the steps of: adhering a sheet of pellicle film on a temporary frame, adhering a plurality of split frames, which are combined with each other and have outer dimensions smaller than inner dimensions of the temporary frame, on the pellicle film adhered on the temporary frame; cutting the pellicle film from the temporary frame along the outer sides of the split frames and separating the combined split frames; and attaching the pellicle film adhered on the split frames onto the frame and removing the split frames.

Transmittance is very important in pellicle. However, because pellicles generally have transmittance of less than 90%, pellicles with higher transmittance are required.

However, the CNT thin film can obtain high EUV transmittance due to low atom density, but has a disadvantage in that the CNT is etched (damaged) by a plasma since being made of carbon.

SUMMARY OF THE INVENTION

Accordingly, the present invention has been made to solve the above-mentioned problems occurring in the prior arts, and it is an object of the present invention to provide a pellicle structure for EUV lithography with high reliability and a manufacturing method therefor, which can manufacture pellicles utilizing carbon nano tubes with high transmittance to solve a problem that the pellicles are damaged by plasma around the pellicles as time goes by.

It is another object of the present invention to provide a pellicle structure for EUV lithography and a manufacturing method therefor, which can manufacture pellicles utilizing carbon nano tubes to be used for a long time without any problem due to each of selected materials.

The technical problems to be solved by the present invention is not limited to the above description.

To accomplish the above object, according to the present invention, there is provided a method for manufacturing a pellicle including the steps of:

(a) preparing a lower layer member having a first base layer, a first protective thin film, and a first CNT thin film;

(b) preparing a first upper layer member having a second base layer, a second protective thin film, and a second CNT thin film or a second upper layer member having a second base layer and a second protective thin film;

(c) arranging the lower layer member above the first CNT thin film;

(d) forming a group member by arranging the second CNT thin film of the first upper layer member or the second protective film of the second upper layer member to be stacked on the first CNT thin film;

(e) removing the second base layer from the group member; and (f) removing the central portion of the first base layer from the group member.

Moreover, after the step (e), the method for manufacturing a pellicle further includes the step (f) of removing the central portion of the first base layer from the group member.

Furthermore, the step (a) includes the steps of:
(a1) preparing the first base layer;
(a2) preparing the first protective thin film on the upper surface of the first base layer; and
(a3) arranging the first CNT thin film on the upper surface of the first protective thin film.

Additionally, the step (b) includes the steps of:
(b1) preparing the second base layer;
(b2) preparing the second protective thin film on the upper surface of the second base layer; and
(b3) arranging the second CNT thin film on the upper surface of the second protective thin film 210.

In addition, the first and second base layers are silicon substrates.

Moreover, the first and second protective thin films are made of one among ruthenium (Ru) and silicon carbide (SiC).

Furthermore, a pellicle for EUV lithography having a CNT thin film layer is manufactured using the invention described above.

The method for manufacturing a pellicle for EUV lithography according to an embodiment of the present invention can manufacture a pellicle having a CNT thin film layer with high transparency, durability, mechanical rigidity, and greater resistance to plasma generated during exposure.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
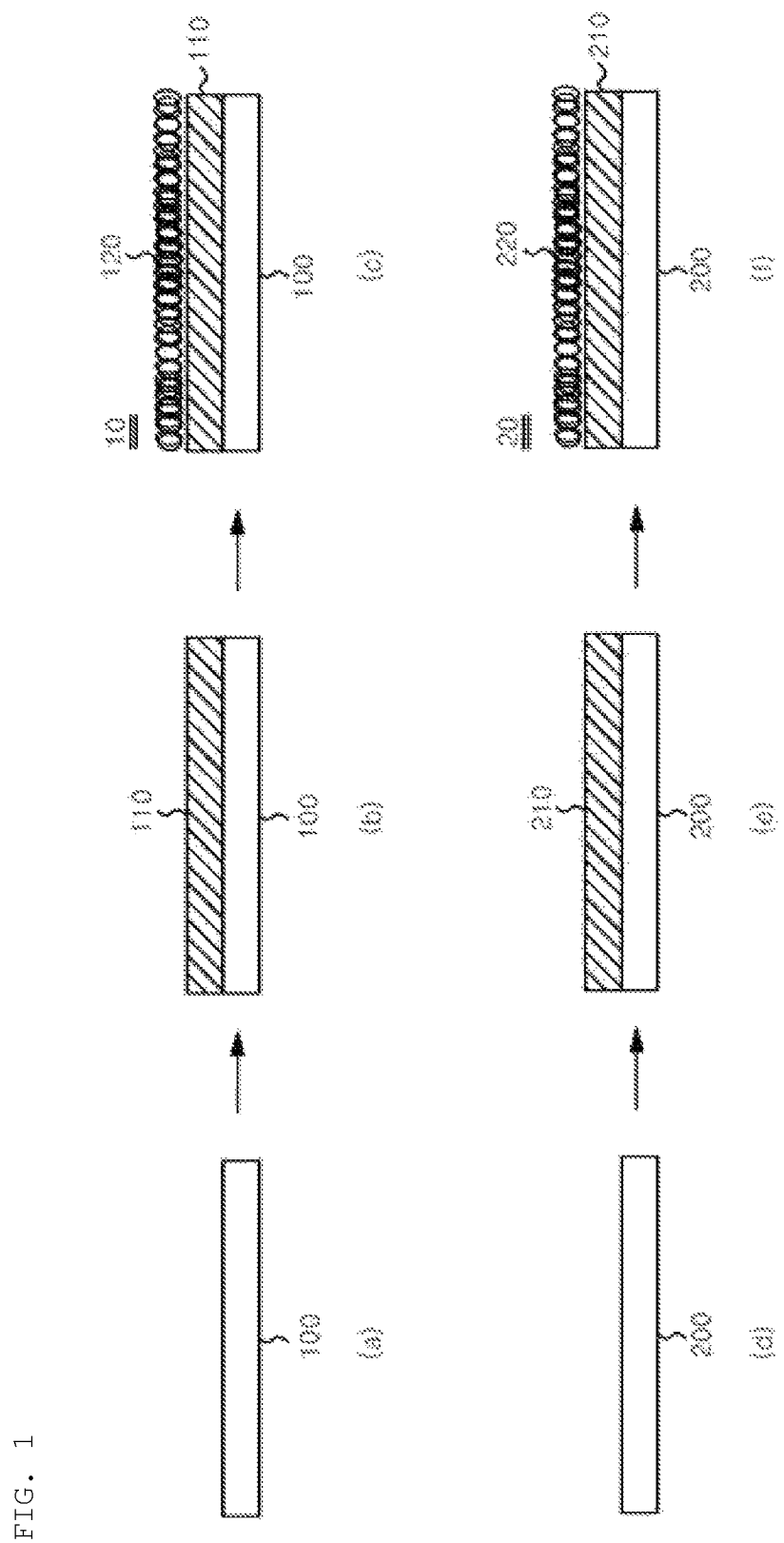
FIG. 1 is a flow chart for illustrating a method for manufacturing an upper layer member and a lower layer member to manufacture a pellicle according to an embodiment of the present invention.

Hereinafter, preferred embodiments of the present invention will be described in detail with reference to the accompanying drawings. However, it will be understood by those skilled in the art that the technical idea of the present invention is not limited by the embodiments and may be modified in various different ways. On the contrary, exemplary embodiments introduced herein are provided to make disclosed contents thorough and complete and to sufficiently transfer the spirit of the present invention to those skilled in the art.

It will be understood that, when an element is referred to as being on another element, the element can be directly on the other element, or intervening elements may be present. Further, in the drawings, the sizes of elements may be exaggerated for effective description of technical contents.

Moreover, in the various exemplary embodiments of the specification, the terms, "first", "second", "third", and the like are used to describe various constituent elements, but the constituent elements are not limited to the terms. The terms are used only to distinguish one constituent element from other. Therefore, a part referred to as a first element in any one embodiment may be referred to as a second element in another embodiment. Here, the exemplary embodiments described and exemplarily illustrated herein include complementary exemplary embodiments. Furthermore, in the present specification, the term "and/or" is understood to include at least one of the constituent elements that are enumerated in the context.

Additionally, a singular form also includes a plural form unless particularly stated otherwise in the present specification. In addition, the terms such as "include" and "have" are intended to indicate that features, numbers, steps, components, or combinations thereof used in the following description exist and it should thus be understood that the possibility of existence or addition of one or more other different features, numbers, steps, components, or combinations thereof is not excluded.

Furthermore, when it is judged that detailed descriptions of known functions or structures related with the present invention may make the essential points vague, the detailed descriptions of the known functions or structures will be omitted.

Figure 2:
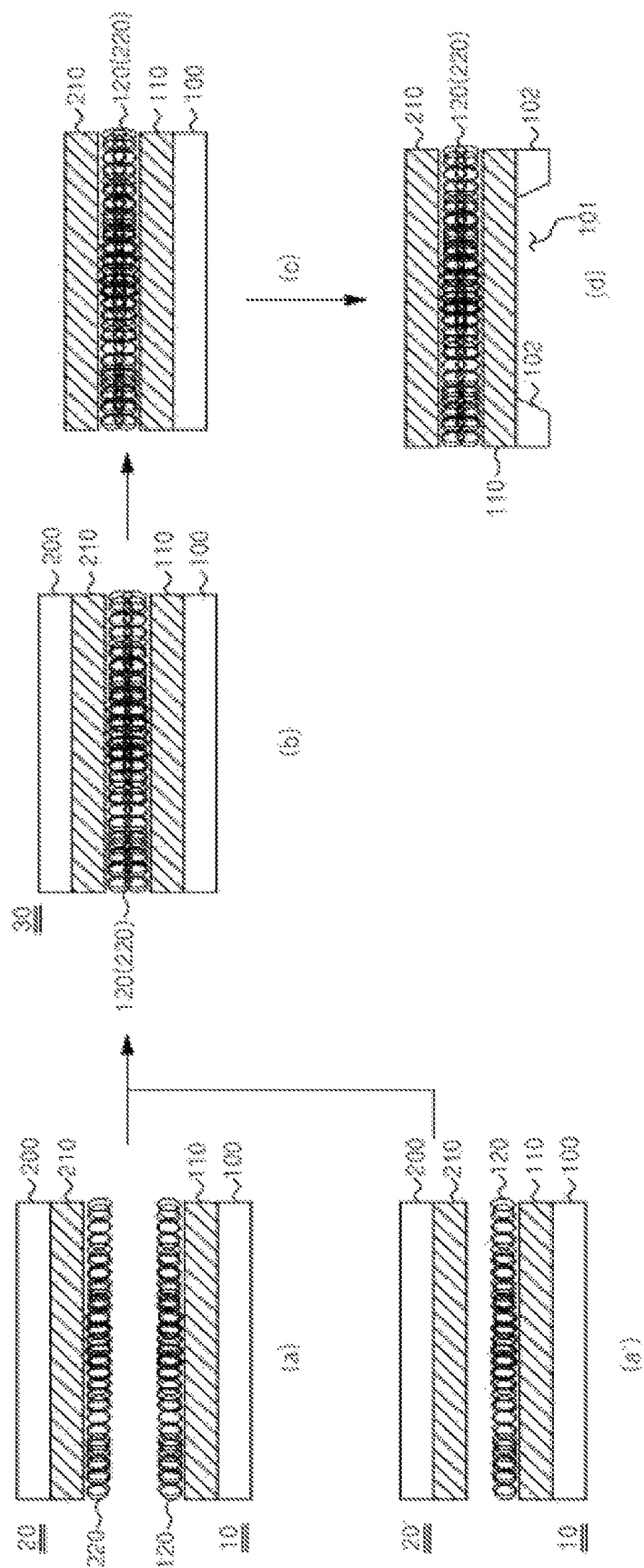
FIG. 2 is a flow chart for illustrating the method for manufacturing a pellicle according to the embodiment of the present invention utilizing the upper layer member and the lower layer member.

Referring to FIGS. 1 and 2, a method for manufacturing a pellicle according to an embodiment of the present invention will be described.

The method for manufacturing a pellicle according to the embodiment of the present invention includes a step (a) of preparing a lower layer member 10 (FIG. 2a) having a first base layer 100, a first protective thin film 110, and a first CNT thin film 120.

In this instance, the step (a) of preparing the lower layer member 10 includes the steps of: (a1) preparing the first base layer 100 (FIG. 1a); (a2) preparing the first protective thin film 110 on the upper surface of the first base layer (FIG. 1b); and (a3) arranging the first CNT thin film 120 on the upper surface of the first protective thin film 110.

Moreover, the method for manufacturing a pellicle according to the embodiment of the present invention includes a step (b) of preparing a first upper layer member 20 having a second base layer 200, a second protective thin film 210, and a second CNT thin film 220 (FIG. 2a) or a second upper layer member 20' having a second base layer 200 and a second protective thin film 210 (FIG. 2a').

In this instance, the step (b) of preparing the first upper layer member 20 includes the steps of: (b1) preparing the second base layer 200 (FIG. 1d); (b2) preparing the second protective thin film 210 on the upper surface of the second base layer (FIG. 1e); (b3) arranging the second CNT thin film 220 on the upper surface of the second protective thin film 210 (FIG. 1f).

The first protective thin film and the first CNT thin film, or the second protective thin film and the second CNT thin film are adhered through van der Waals forces, which are forces between atoms, without any additional adhesive member, or are adhered strongly by pressure or high temperature if necessary.

After the step (b), the method for manufacturing a pellicle according to the embodiment of the present invention further includes: a step (c) of arranging the lower layer member 10 above the first CNT thin film; and a step (d) of forming a group member 30 (FIG. 2b) by arranging the second CNT thin film 220 of the first upper layer member 20 or the second protective film 210 of the second upper layer member 20' to be stacked on the first CNT thin film 120.

In this instance, the first CNT thin film and the second CNT thin film 220 or the first CNT thin film and the second protective thin film 210 are adhered through van der Waals forces, which are forces between atoms, without any additional adhesive member, or are adhered strongly by pressure or high temperature if necessary.

After the step (d), the method for manufacturing a pellicle according to the embodiment of the present invention further includes a step (e) of removing the second base layer 200 from the group member 30 (FIG. 2c).

In this instance, it is preferable to remove the second base layer 200 and a part of the central portion of the first base layer 100 using an etching process of a semiconductor process.

Here, the reason that only a part of the central portion of the first base layer 100 is removed is to use as a support part 102 to set the pellicle up.

After the step (e), the method for manufacturing a pellicle according to the embodiment of the present invention further includes a step (f) of removing the central portion of the first base layer 100 from the group member 30 (FIG. 2d).

Moreover, the first and second base layers are silicon substrates.

Furthermore, the first and second protective thin films are made of one among ruthenium (Ru) and silicon carbide (SiC).

Additionally, the present invention is characterized by manufacturing the pellicle for EUV lithography having the CNT thin film layer manufactured according to the above description.

The method for manufacturing a pellicle for EUV lithography according to an embodiment of the present invention can manufacture a pellicle having a CNT thin film layer with high transparency, durability, mechanical rigidity, and greater resistance to plasma generated during exposure.

As described above, while the present invention has been particularly shown and described with reference to the example embodiments thereof, it will be understood that the present invention is not limited by the specific embodiments and the scope of the present invention should be construed based on the following appended claims. Moreover, it will be understood by those of ordinary skill in the art that various changes, modifications and equivalents may be made in the present invention without departing from the technical scope and idea of the present invention.

What is claimed is:

1. A method for manufacturing a pellicle for EUV lithography or a debris shield for an EUV light source having a carbon nano tube (CNT) thin film layer, the manufacturing method comprising the steps of:
   (a) preparing a lower layer member having a first base layer, a first protective thin film, and a first CNT thin film;
   (b) preparing a first upper layer member having a second base layer, a second protective thin film, and a second CNT thin film or a second upper layer member having a second base layer and a second protective thin film;
   (c) arranging the lower layer member above the first CNT thin film;
   (d) forming a group member by arranging the second CNT thin film of the first upper layer member or the second protective film of the second upper layer member to be stacked on the first CNT thin film; and
   (e) removing the second base layer from the group member.

2. The manufacturing method according to claim 1, further comprising the step of:
   (f) removing the central portion of the first base layer from the group member.

3. The manufacturing method according to claim 1, wherein the step (a) comprises the steps of:
   (a1) preparing the first base layer;
   (a2) preparing the first protective thin film on the upper surface of the first base layer; and
   (a3) arranging the first CNT thin film on the upper surface of the first protective thin film.

4. The manufacturing method according to claim 1, wherein in order to manufacture the first upper layer member, the step (b) comprises the steps of:
   (b1) preparing the second base layer;
   (b2) preparing the second protective thin film on the upper surface of the second base layer; and
   (b3) arranging the second CNT thin film on the upper surface of the second protective thin film 210, and
   wherein in order to manufacture the second upper layer member, the step (b) comprises the steps of:
   (b1) preparing the second base layer; and
   (b2) preparing the second protective thin film on the upper surface of the second base layer.

5. The manufacturing method according to claim 1, wherein the first and second base layers are silicon substrates.

6. The manufacturing method according to claim 1, wherein the first and second protective thin films are made of one among ruthenium (Ru) and silicon carbide (SiC).

7. A pellicle for EUV lithography having a CNT thin film layer manufactured according to claim 1.

* * * * *